(12) United States Patent
Mamaril et al.

(10) Patent No.: US 8,686,800 B2
(45) Date of Patent: *Apr. 1, 2014

(54) FREQUENCY REFERENCE SIGNAL GENERATING SYSTEM AND METHOD FOR FREQUENCY SYNTHESIZERS

(71) Applicant: Comtech EF Data Corp., Tempe, AZ (US)

(72) Inventors: Cris Mamaril, Mesa, AZ (US); Tiberiu Artzi, Cave Creek, AZ (US); Terry Richmond, Scottsdale, AZ (US)

(73) Assignee: Comtech EF Data Corp., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/676,011

(22) Filed: Nov. 13, 2012

(65) Prior Publication Data

US 2013/0069695 A1 Mar. 21, 2013

Related U.S. Application Data

(62) Division of application No. 12/878,908, filed on Sep. 9, 2010, now Pat. No. 8,310,315.

(60) Provisional application No. 61/240,903, filed on Sep. 9, 2009.

(51) Int. Cl.
*H03B 1/00* (2006.01)

(52) U.S. Cl.
USPC .............................................. 331/74; 331/77

(58) Field of Classification Search
USPC ....................................................... 331/74, 77
See application file for complete search history.

(56) References Cited

U.S. PATENT DOCUMENTS 5,146,186 A 9/1992 Vella
2011/0075780 A1 3/2011 Petrovic

*Primary Examiner* — Joseph Chang
(74) *Attorney, Agent, or Firm* — Booth Udall Fuller, PLC

(57) ABSTRACT

A system for generating a frequency reference signal comprising an oscillator, a direct digital synthesizer coupled to the oscillator and configured to receive a signal output from the oscillator, a digital to analog converter coupled to the direct digital synthesizer and configured to receive a sampled signal from the direct digital synthesizer and to convert the sampled signal to an analog waveform, and a bandpass filter coupled to the digital to analog converter and configured to select an aliased output signal from the digital to analog converter at a Nyquist zone other than a first Nyquist zone and to output the frequency reference signal.

27 Claims, 8 Drawing Sheets

FREQUENCY REFERENCE SIGNAL GENERATING SYSTEM AND METHOD FOR FREQUENCY SYNTHESIZERS

CROSS REFERENCE TO RELATED APPLICATIONS

This document in a divisional application of earlier U.S. patent application Ser. No. 12/878,908, entitled "Frequency Reference Signal Generating System and Method for Frequency Synthesizers" to Cris Mamaril et al, which was filed on Sep. 9, 2010, which application claims the benefit of the filing date of U.S. Provisional Patent Application No. 61/240, 903, entitled "Frequency Reference Signal Generating System for Frequency Synthesizers" to Cris Mamaril, et al., which was filed on Sep. 9, 2009, the disclosures of which are hereby incorporated entirely by reference herein.

BACKGROUND

1. Technical Field

Aspects of this document relate generally to telecommunication systems and techniques for generating frequency reference signals for frequency synthesizers.

2. Background Art

Conventional frequency reference signal generating systems involve providing a frequency reference for a phase locked loop that is utilized in a high frequency synthesizer for a telecommunication system, such as a radio frequency (RF) communication system. The phase locked loop is used to synthesize the carrier signal that is used to transmit encoded data over a telecommunications channel.

Frequency reference signal generating systems may be employed in conjunction with phase locked loops and other components in modulators and demodulators where a stable and accurate frequency reference signal is desired. For example, such phase locked loops that may employ such a reference signal can be found in U.S. Pat. No. 5,528,240 to Wilson et al., entitled "Digital Phase-Locked Loop Utilizing a High Order Sigma-Delta Modulator," issued Jun. 18, 1996, the disclosure of which is hereby entirely incorporated herein by reference.

SUMMARY

Implementations of frequency reference generating systems like those disclosed in may comprise an oscillator and a direct digital synthesizer coupled to the oscillator and configured to receive a signal output from the oscillator. A digital to analog converter may be coupled to the direct digital synthesizer and configured to receive a sampled signal from the direct digital synthesizer and convert the sampled signal to an analog waveform. A bandpass filter may also be coupled to the digital to analog converter and configured to select an aliased output signal from the digital to analog converter at a Nyquist zone other than the first Nyquist zone and to output the frequency reference signal.

In some aspects, the oscillator is a 10 MHz crystal oscillator. The Nyquist zone selected by the bandpass filter may be a third Nyquist zone. The frequency reference signal generated may be at a frequency of approximately 13 MHz.

In some implementations, a system for generating a frequency reference signal comprises a crystal oscillator, a numerically controlled oscillator coupled to the crystal oscillator and configured to receive a signal output from the crystal oscillator, a digital to analog converter coupled to the numerically controlled oscillator and configured to receive a sideband signal from the numerically controlled oscillator and to generate a counting sequence according to a frequency control word stored by the numerically controlled oscillator and a bandpass filter coupled to the digital to analog converter and configured to select an aliased output signal from the digital to analog converter at a Nyquist zone other than the first Nyquist zone and to output the frequency reference signal.

In some aspects, the crystal oscillator is at 10 MHz, the Nyquist zone selected by the bandpass filter is a second or third Nyquist zone, and the frequency reference signal is at a frequency of approximately 13 MHz.

In some implementations, a system for generating a frequency reference signal comprises a digital to analog converter that receives and digitizes a signal, a first filter that receives and filters the digitized signal, a first amplifier that receives and amplifies the filtered signal, a second filter that receives and filters the amplified signal, a second amplifier that receives and amplifies the signal from the second filter, and a bandpass filter that receives the signal from the second amplifier, selects a sinewave from a Nyquist zone other than the first Nyquist zone, and outputs the frequency reference signal.

In some aspects, the first and second filters are 13 MHz ceramic filters. The sample rate of the digital to analog converter may be at a frequency of approximately 10 MHz. The frequency reference signal output by the bandpass filter may be at approximately 13.03 MHz. The Nyquist zone selected by the bandpass filter may be a third Nyquist zone.

In some implementations, a method for generating a frequency reference signal comprises synthesizing a signal output received from an oscillator with a direct digital synthesizer, converting a sampled signal received from the direct digital synthesizer to an analog waveform with a digital to analog converter, selecting an aliased output signal from the digital to analog converter at a Nyquist zone other than the first Nyquist zone with a bandpass filter, and outputting the frequency reference signal from the bandpass filter.

In some aspects, the oscillator is a 10 MHz crystal oscillator. The Nyquist zone selected by the bandpass filter may be a third Nyquist zone. The frequency reference signal may be sampled at a frequency of approximately 13 MHz.

In some implementations, a method for generating a frequency reference signal, comprises receiving a signal output from a crystal oscillator by a numerically controlled oscillator, outputting a sideband signal from the numerically controlled oscillator, receiving the sideband signal from the numerically controlled oscillator with a digital to analog converter, generating a counting sequence according to a frequency control word stored by the numerically controlled oscillator with the digital to analog converter, selecting an aliased output signal received from the digital to analog converter at a Nyquist zone other than the first Nyquist zone with a bandpass filter, and outputting the frequency reference signal from the bandpass filter.

In some aspects, the crystal oscillator is at 10 MHz. The Nyquist zone selected by the bandpass filter may be a second Nyquist zone. The Nyquist zone selected by the bandpass filter may be a third Nyquist zone. The frequency reference signal may be at a frequency of approximately 13 MHz.

In some implementations, a method for generating a frequency reference signal comprises converting to analog, by a digital to analog converter, a sinewave, filtering, by a first filter, the analog signal received from the digital to analog converter, amplifying, by a first amplifier, the filtered signal received from the first filter, filtering, by a second filter, the amplified signal received from the first amplifier, amplifying, by a second amplifier, the filtered signal received from the second filter, selecting, by a bandpass filter, that receives the signal from the second amplifier, a Nyquist zone other than the first Nyquist zone of the signal received from the second filter, and outputting, by the bandpass filter, the frequency reference signal.

In some aspects, the first and second filters are 13 MHz crystal or ceramic filters. The sample clock received by the digital to analog converter may be at a frequency of approximately 10 MHz. The frequency reference signal output by the bandpass filter may be at approximately 13.03 MHz. The Nyquist zone selected by the bandpass filter is a third Nyquist zone.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. §112, ¶ 6. Thus, the use of the words "function," "means" or "step" in the Description, Drawings or Claims is not intended to somehow indicate a desire to invoke the special provisions of 35 U.S.C. §112, ¶ 6, to define the invention. To the contrary, if the provisions of 35 U.S.C. §112, ¶ 6 are sought to be invoked to define the inventions, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. §112, ¶ 6. Moreover, even if the provisions of 35 U.S.C. §112, ¶ 6 are invoked to define the claimed disclosure, it is intended that the disclosure not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended telecommunication system components and/or assembly procedures for telecommunication system components will become apparent for use with particular implementations from this disclosure. Accordingly, for example, although particular implementations are disclosed, such implementations and implementing components may comprise any shape, size, style, type, model, version, measurement, concentration, material, quantity, and/or the like as is known in the art for such telecommunication systems and implementing components, consistent with the intended operation.

Additionally, in the following description, and for the purposes of explanation, numerous specific details are set forth in order to provide a thorough understanding of the various aspects of the disclosure. It will be understood, however, by those skilled in the relevant arts, that the present disclosure may be practiced without these specific details. In other instances, known structures and devices are shown or discussed more generally in order to avoid obscuring the disclosed implementations. In many cases, a description of the operation is sufficient to enable one to implement the various forms of the disclosure. It should be noted that there are many different and alternative configurations, devices and technologies to which the disclosed implementations may be applied. The full scope of the disclosure is not limited to the examples that are described below.

Particular implementations of frequency reference signal generating systems as disclosed herein may have one or both of the following advantages over the current state-of-the-art:

The overall cost of the system may be reduced because inexpensive crystal oscillators and other components may be utilized to produce a reference signal with sufficiently low phase noise.

The phase noise in the reference signals generated by implementations of frequency reference signal generating systems may be lower than conventional techniques that utilize a frequency multiplier or mixer.

Figure 1:
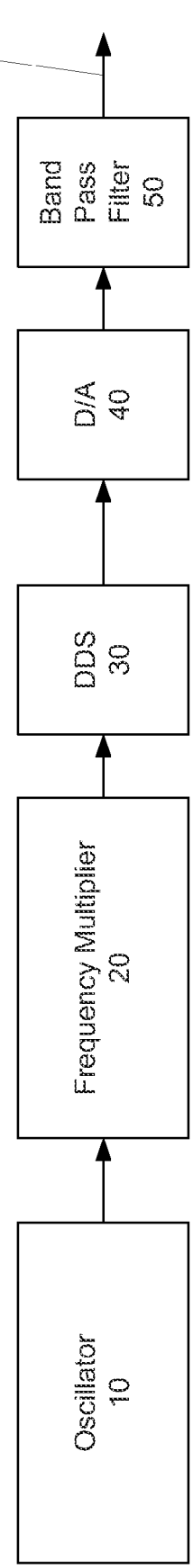
FIGS. 1-2 depict different implementations of conventional frequency generating systems.

Referring now to FIG. 1, which depicts an implementation of a conventional frequency reference signal generating system, as illustrated, an oscillator 10, which may be but is not limited to a high frequency crystal oscillator, is used in conjunction with a frequency multiplier 20 to drive a direct digital synthesizer (DDS) 30 that produces the desired frequency reference signal 60. In this case, a 10 MHz oscillator 10 is multiplied to 100 MHz before being received by the DDS 30.

It should be noted, however, that one of ordinary skill in the art would recognize that an oscillator of any other appropriate frequency may also be used. The digital signal from the DDS 30 is then passed through digital to analog (D/A) converter 40 and low pass and/or bandpass filtered to produce a reference signal 60 which in this example has a frequency of 13 MHz.

Figure 2:
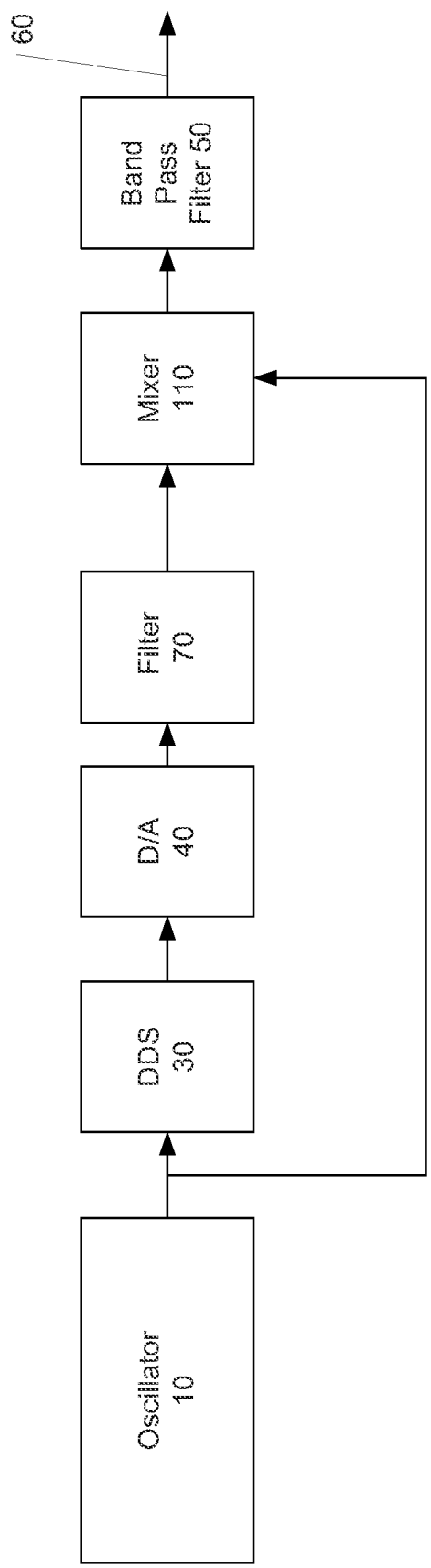

Another conventional frequency reference signal generating system is illustrated in FIG. 2. Here, a mixer 110 is used to multiply the 10 MHz signal from the crystal oscillator 10 with a 3 MHz signal generated by the DDS 30. Because the output of the DDS is at a low frequency, the phase noise of the resulting signal is dominated by the inherently low phase noise of the 10 MHz oscillator 10. The resulting signal can then be filtered by an inexpensive ceramic filter or other bandpass filter device 50.

Conventional approaches to generating a frequency reference signal involve use of various components that often require expensive and/or relatively complex circuitry. In this document, various implementations of a frequency reference signal generating system are disclosed. Particular implementations may provide reduced circuitry, cost, and/or decreased phase noise in the reference signal. An implementation of a frequency reference signal generating system provided as an example of those disclosed in this document is illustrated in FIG. 3.

Figure 3:
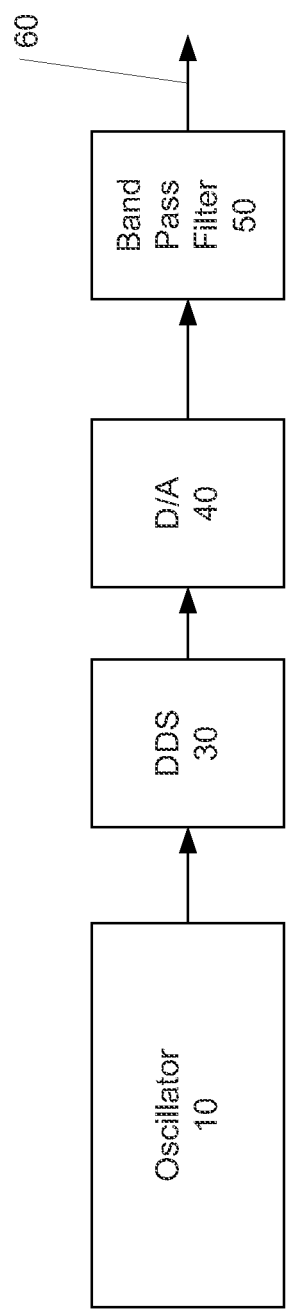
FIGS. 3-5 depict different implementations of frequency reference signal generating systems.

As illustrated in the non-limiting example of FIG. 3, the output of a 10 MHz crystal oscillator 10 is received by a DDS 30 which generates a sampled signal at 3 MHz. Following conversion to an analog waveform by the D/A unit 40, the aliased output of the D/A at the third Nyquist zone is selected for processing by a bandpass filter and used to form the reference 13 MHz signal.

One of ordinary skill in the art would be aware that the Nyquist frequency is the sample rate divided by two (Fs/2) and that the frequency range from DC (or 0 Hz) to Fs/2 is called the first Nyquist zone. An alternative to baseband sampling is to sample an IF signal that is in the second or third Nyquist zone (i.e., from (N−1)F(s)/2 to NF(s)/2). Thus, the second Nyquist zone is from F(s)/2 to F(s) and the third is from F(s) to (3/2)F(s).

While both conventional frequency multiplication and the disclosed implementations result in phase noise degradation that is 20 times the logarithm of the multiplication factor used in the DDS, implementations such as those disclosed herein have the advantage of eliminating all mixing processes by selecting the alias, regardless of whether a conventional mixer or phase-locked loop is used. Use of conventional mixing to generate the reference signal results in a reference signal with phase noise that is the convolution of the phase noise profiles of the reference 10 MHz crystal oscillator signal and the 3 MHz signal produced by the DDS 30. Because the resulting phase noise is the convolution of the two signals, the resulting phase noise will inherently be higher than either of the two signals alone. Because no frequency multiplication is used and the aliased output of the third Nyquist zone can be more accurately filtered with low cost components, the resulting reference signal may have a lower close-in (<100 Hz) phase noise than the conventional approaches.

While the foregoing has discussed the use of the aliased output of the D/A unit at the third Nyquist zone, other implementations of frequency reference signal generating systems may utilize aliased outputs at other Nyquist zones, such as the second Nyquist zone. The selection of the particular Nyquist zone may depend upon the ease of filtering the signal as well as the desired output frequency of the reference signal for a particular implementation, and particular implementations may actively select the particular Nyquist zone to be used with a particular signal based on the characteristics of the signal.

Figure 4:
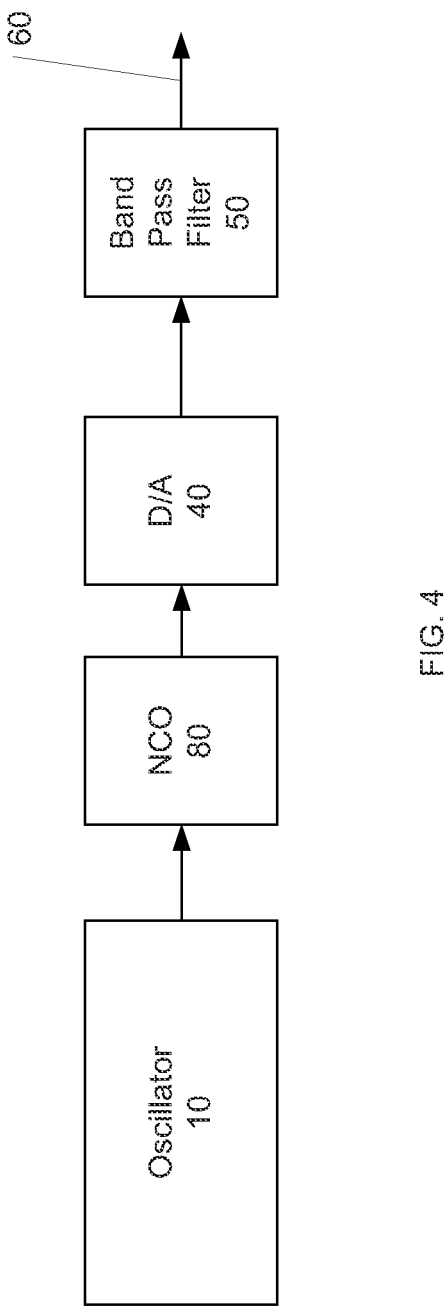

Another implementation of a frequency reference signal generating system like those disclosed in this document is illustrated in FIG. 4. As illustrated, in this implementation, a crystal oscillator 10 provides a reference signal to a numerically controlled oscillator (NCO) 80, which generates a lower sideband signal at 3 MHz which is subsequently digitized by the D/A unit 40. Again, the aliased output from the third Nyquist zone is selected and passed through a narrow bandpass filter 50 to extract the desired 13 MHz reference frequency 60. Like the implementations previously discussed, the use of an NCO 80 with no frequency multipliers or mixing components may result in a less complex system that costs less to implement. In addition, the system may produce a reference frequency that includes less phase noise than systems utilizing frequency multipliers or mixers. Also, as was discussed in the previous implementation, the use of the aliased output at the third Nyquist zone allows the extraction of a 13 MHz signal from the 3 MHz signal produced by the NCO 80. Signals from other Nyquist zones, such as the second Nyquist zone, could also be utilized in particular implementations.

Implementations of frequency reference signal generating systems like those disclosed in this document may be used in high order digital modulation techniques such as Quadrature Amplitude Modulation (QAM) and Phase Shift Keying (PSK), which utilize the low phase noise frequency reference signal for frequency synthesizers incorporated in the modulators and demodulators. In high order digital modulation techniques, controlling phase noise in the frequency reference may be significant because phase noise in the local oscillator degrades the error performance of high order modulation signal.

Figure 5:
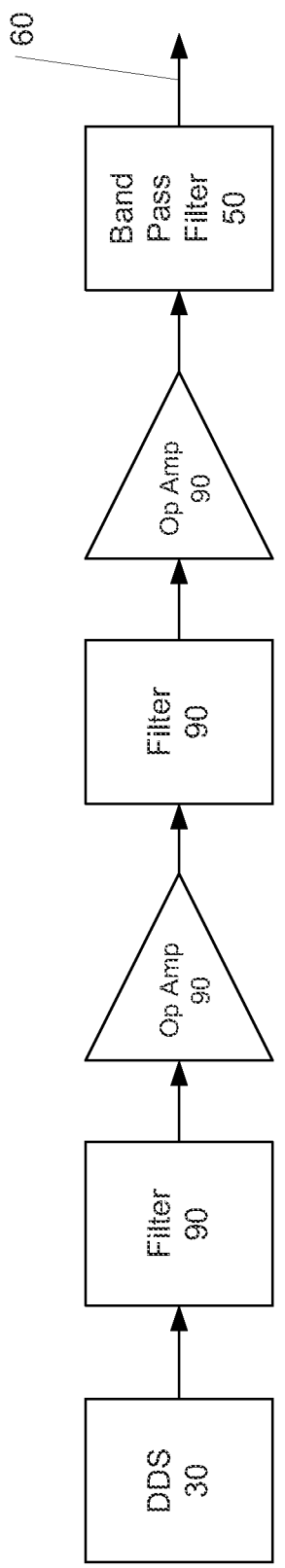

FIG. 5 is an example of another implementation of a frequency reference signal generating system. Like the other particular implementations of frequency reference signal generating systems disclosed in this document, this implementation may be incorporated into system implementations for higher order digital modulators.

As illustrated in FIG. 5, a reference signal, for example, a 10 Mhz reference signal, is received by a DDS 30. A non-limiting example of a DDS that may be used in this implementation is an AD9951 manufactured by Analog Devices of Norwood, Mass. and which includes an analog to digital converter. The resulting digital signal may be filtered using a ceramic filter 90 and then passed through an amplifier 100, such as an operational amplifier, such as, by non-limiting example an HFA1135 manufactured by Intersil of Milpitas, Calif. After passing through another filter 90 and another amplifer 100, the third Nyquist band is removed by a bandpass filter 50 to produce the 13.03 MHz reference signal 60.

The materials used for implementations of frequency reference signal generating systems may be made of conventional components used to make goods similar to these in the art, such as, by non-limiting example, FPGA's, microcontrollers or microprocessors, resistive ladders, ceramics, crystal materials, and the like. Those of ordinary skill in the art will readily be able to select appropriate materials and manufacture these products from the disclosures provided herein.

Figure 6:
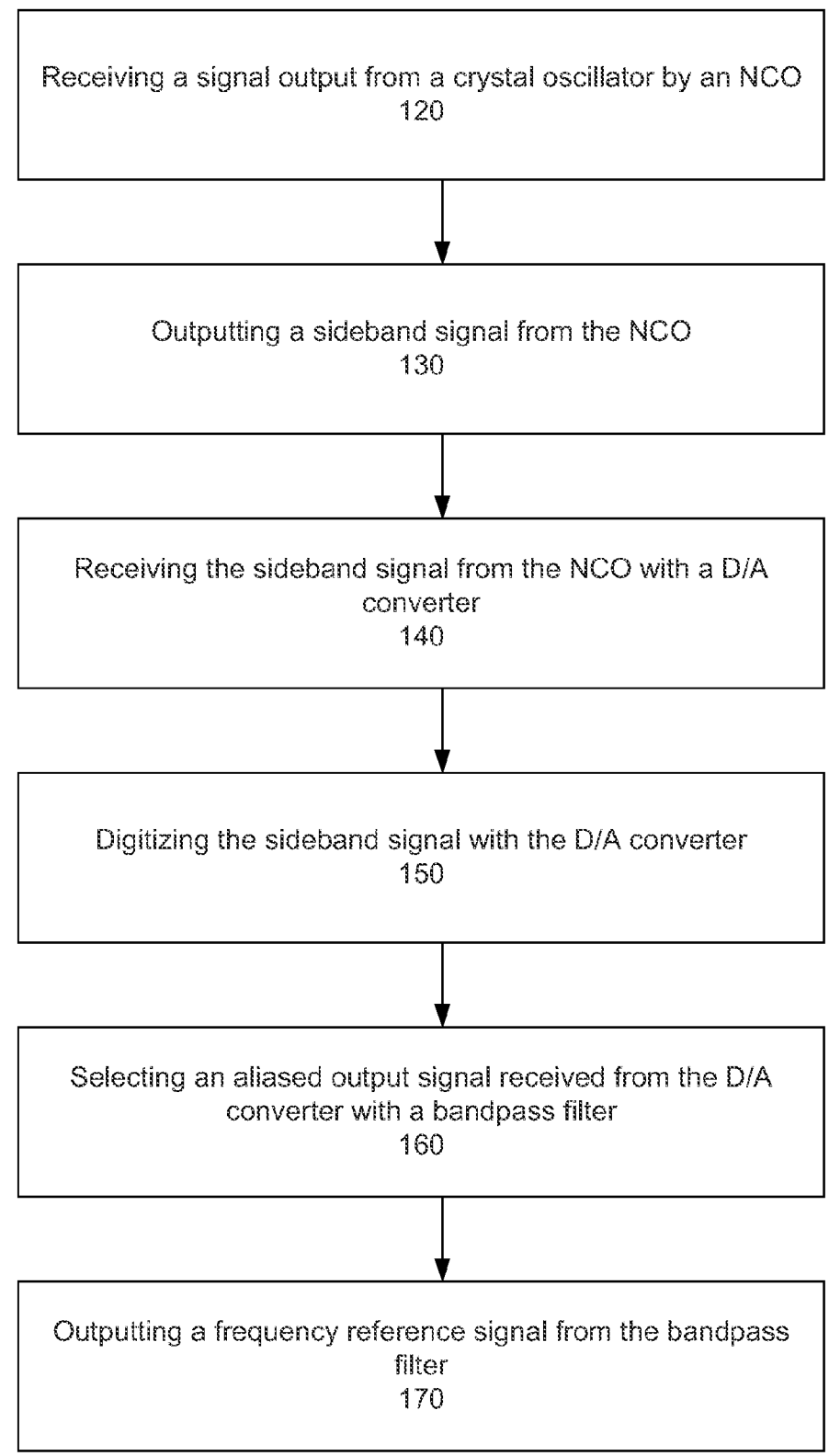
FIGS. 6-8 are block diagrams of implementations of various methods of frequency reference signal generation.

FIG. 6 depicts an implementation of a method of frequency reference signal generation that begins with receiving a signal output from a crystal osciallator by a numerically controlled oscillator (NCO) 120. The NCO then outputs a sideband signal from the NCO 130 and a digital to analog (D/A) converter receives the sideband signal from the NCO 140. The D/A converter then digitizes the sideband signal 150 and a bandpass filter selects an aliased output signal that is received from the D/A converter at a zone other than the first Nyquist zone 160. A frequency reference signal is then output from the bandpass filter 170.

Figure 7:
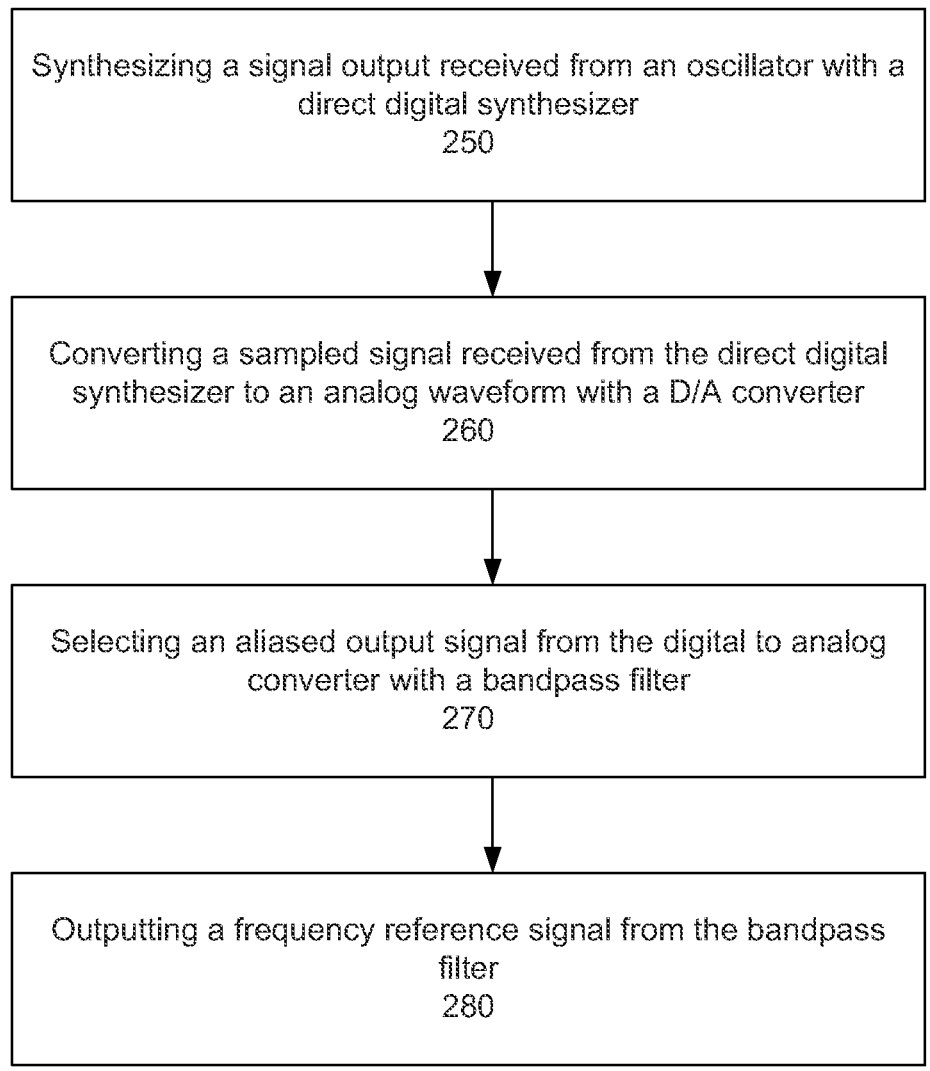

Another implementation of a method of frequency reference signal generation is depicted in FIG. 7. A direct digital synthesizer (DDS) synthesizes a signal previously output from an oscillator and received by the DDS 250. A sampled signal received from the DDS is then converted to an analog waveform by a D/A converter 260. A bandpass filter then selects an aliased output signal from the D/A converter at a zone other than the first Nyquist zone 270 and the bandpass filter then outputs a frequency reference signal 280.

Figure 8:
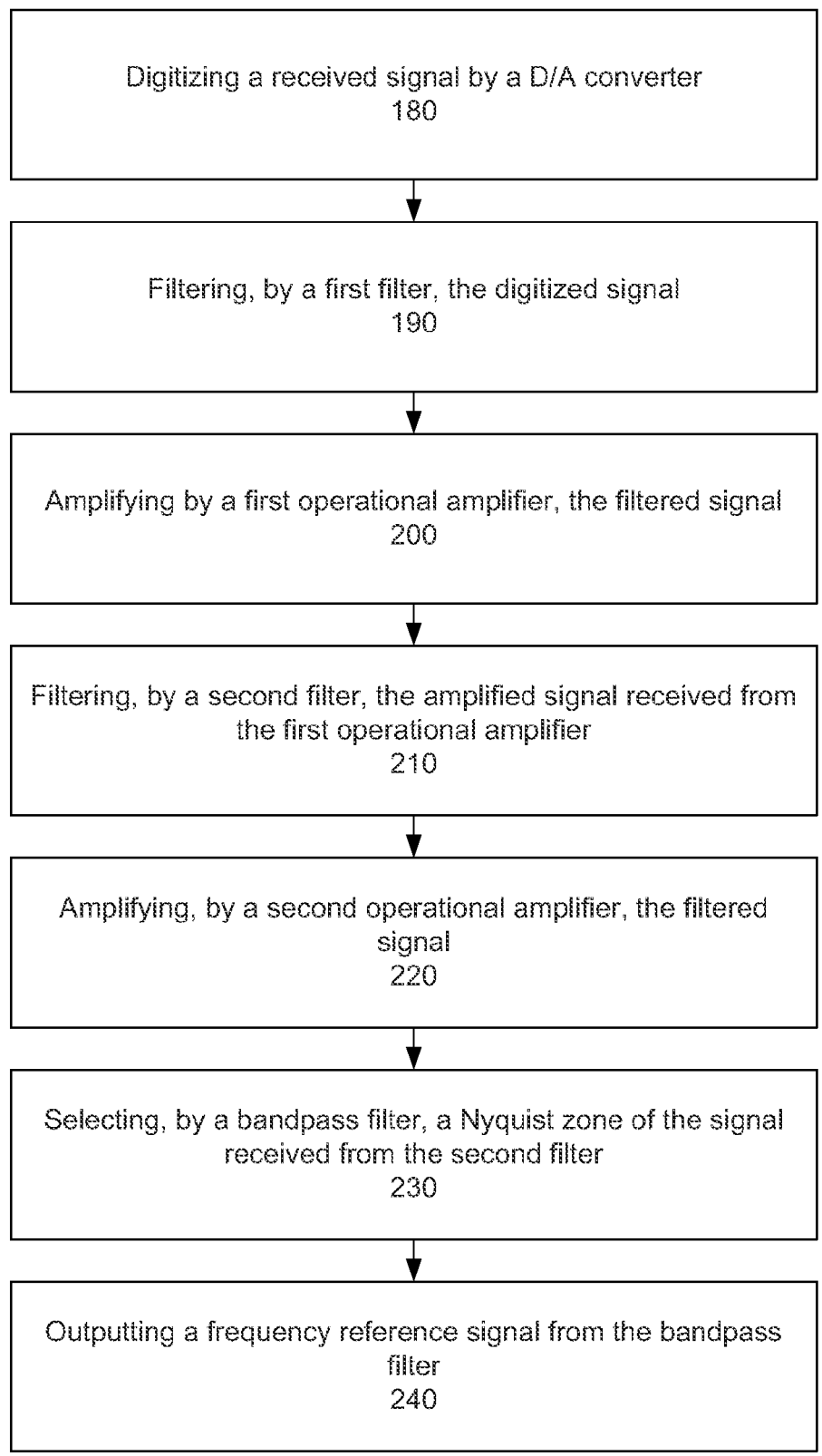

Additionally, FIG. 8 depicts another implementation of a method of generating a frequency reference signal. A D/A converter digitizes a received signal 180 and the digitized signal is then filtered by a first filter 190, which may be, but is not limited to a ceramic filter. The filtered signal is then amplified by a first amplifier 200, which may be, but is not limited to an operational amplifier (op amp) and a second filter then receives and filters the amplified signal from the first amplifier 220. A bandpass filter then selects a Nyquist zone of the signal received from the second filter at a zone other than the first Nyquist zone 230 and outputs the frequency reference signal 240.

One of ordinary skill in the art would know that while any suitable components may be used to implement the disclosed methods and systems, it may be preferable to use readily available components such as 10 MHz crystal oscillators or ceramic filters and it may be preferable to produce a frequency reference signal that is approximately at 13 MHz.

The implementations listed here, and many others, will become readily apparent from this disclosure. From this, those of ordinary skill in the art will readily understand the versatility with which this disclosure may be applied.

In places where the description above refers to particular implementations of frequency reference generating systems and methods, it should be readily apparent that a number of modifications may be made without departing from the spirit thereof and that these implementations may be applied to other telecommunication and frequency reference code generating implementations.

The invention claimed is:

1. A system for generating a frequency reference signal comprising:
   a crystal oscillator;
   a numerically controlled oscillator coupled to the crystal oscillator and configured to receive a signal output from the crystal oscillator;
   a digital to analog converter coupled to the numerically controlled oscillator and configured to receive a sideband signal from the numerically controlled oscillator and to generate a counting sequence according to a frequency control word stored by the numerically controlled oscillator; and
   a bandpass filter coupled to the digital to analog converter and configured to select an aliased output signal from the digital to analog converter at a Nyquist zone other than a first Nyquist zone and to output the frequency reference signal.

2. The system of claim 1, wherein the crystal oscillator is at 10 MHz.

3. The system of claim 1, wherein the Nyquist zone selected by the bandpass filter is a second Nyquist zone.

4. The system of claim 1, wherein the Nyquist zone selected by the bandpass filter is a third Nyquist zone.

5. The system of claim 1, wherein the frequency reference signal is at a frequency of approximately 13 MHz.

6. A method for generating a frequency reference signal, the method comprising:
   receiving a signal output from a crystal oscillator by a numerically controlled oscillator;
   outputting a sideband signal from the numerically controlled oscillator;
   receiving the sideband signal from the numerically controlled oscillator with a digital to analog converter;
   generating a counting sequence according to a frequency control word stored by the numerically controlled oscillator with the digital to analog converter;
   selecting an aliased output signal received from the digital to analog converter at a Nyquist zone other than a first Nyquist zone with a bandpass filter; and
   outputting the frequency reference signal from the bandpass filter.

7. The method of claim 6, wherein the Nyquist zone selected by the bandpass filter is a second Nyquist zone.

8. The method of claim 6, wherein the Nyquist zone selected by the bandpass filter is a third Nyquist zone.

9. The method of claim 6, wherein the frequency reference signal is at a frequency of approximately 13 MHz.

10. A system for generating a frequency reference signal comprising:
    a first oscillator;
    a second oscillator coupled to the first oscillator and configured to receive a signal output from the first oscillator;
    a digital to analog converter coupled to the second oscillator and configured to receive a sideband signal from the second oscillator; and
    a bandpass filter coupled to the digital to analog converter and configured to select an aliased output signal from the digital to analog converter at a Nyquist zone other than a first Nyquist zone and to output the frequency reference signal.

11. The system of claim 10, wherein the digital to analog converter is further configured to generate a counting sequence according to a frequency control word stored by the second oscillator.

12. The system of claim 10, wherein the first oscillator comprises a crystal oscillator.

13. The system of claim 10, wherein the second oscillator comprise a numerically controlled oscillator.

14. The system of claim 12, wherein the crystal oscillator is at a frequency of 10 MHz.

15. The system of claim 13, wherein the numerically controlled oscillator is at a frequency of 3 MHz.

16. The system of claim 10, wherein the Nyquist zone selected by the bandpass filter is a second Nyquist zone.

17. The system of claim 10, wherein the Nyquist zone selected by the bandpass filter is a third Nyquist zone.

18. The system of claim 10, wherein the frequency reference signal is at a frequency of approximately 13 MHz.

19. A method for generating a frequency reference signal, the method comprising:
    receiving a signal output from a first oscillator by a second oscillator;
    outputting a sideband signal from the second oscillator;
    receiving the sideband signal from second controlled oscillator with a digital to analog converter;
    selecting an aliased output signal received from the digital to analog converter at a Nyquist zone other than a first Nyquist zone with a bandpass filter; and
    outputting the frequency reference signal from the bandpass filter.

20. The method of claim 19, further comprising generating a counting sequence according to a frequency control word stored by the second oscillator using the digital to analog converter.

21. The method of claim 19, wherein the first oscillator comprises a crystal oscillator.

22. The method of claim 19, wherein the second oscillator comprise a numerically controlled oscillator.

23. The method of claim 21, wherein the crystal oscillator is at a frequency of 10 MHz.

24. The method of claim 22, wherein the numerically controlled oscillator is at a frequency of 3 MHz.

25. The method of claim 19, wherein the Nyquist zone selected by the bandpass filter is a second Nyquist zone.

26. The method of claim 19, wherein the Nyquist zone selected by the bandpass filter is a third Nyquist zone.

27. The system of claim 19, wherein the frequency reference signal is at a frequency of approximately 13 MHz.

* * * * *